(12) United States Patent
Yang et al.

(10) Patent No.: US 11,177,213 B2
(45) Date of Patent: Nov. 16, 2021

(54) EMBEDDED SMALL VIA ANTI-FUSE DEVICE

(71) Applicant: INTERNATIONAL BUSINESS MACHINES CORPORATION, Armonk, NY (US)

(72) Inventors: Chih-Chao Yang, Glenmont, NY (US); Baozhen Li, South Burlington, VT (US); Tianji Zhou, Albany, NY (US); Ashim Dutta, Menands, NY (US); Saumya Sharma, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/774,922

(22) Filed: Jan. 28, 2020

(65) Prior Publication Data
US 2021/0233843 A1    Jul. 29, 2021

(51) Int. Cl.
*H01L 23/525* (2006.01)
*H01L 21/768* (2006.01)
*H01L 23/522* (2006.01)

(52) U.S. Cl.
CPC .... *H01L 23/5252* (2013.01); *H01L 21/76877* (2013.01); *H01L 21/76886* (2013.01); *H01L 23/5226* (2013.01)

(58) Field of Classification Search
CPC ............. H01L 23/5252; H01L 23/5226; H01L 21/76877; H01L 21/76886
See application file for complete search history.

(56) References Cited

U.S. PATENT DOCUMENTS

| | | | |
|---|---|---|---|
| 5,714,795 A | 2/1998 | Ohmi et al. | |
| 5,759,876 A | 6/1998 | Singlevich et al. | |
| 5,789,795 A | 8/1998 | Sanchez et al. | |
| 6,087,677 A | 7/2000 | Wu | |
| 6,124,194 A | 9/2000 | Shao et al. | |
| 6,251,710 B1 | 6/2001 | Radens et al. | |
| 6,335,228 B1 | 1/2002 | Fuller et al. | |
| 8,785,300 B2 | 7/2014 | Kurz et al. | |
| 9,786,595 B1 * | 10/2017 | Adusumilli | H01L 23/5252 |
| 2011/0272664 A1 * | 11/2011 | Tada | H01L 45/04 257/4 |
| 2018/0323067 A1 | 11/2018 | Shu et al. | |
| 2019/0189559 A1 | 6/2019 | Lee | |
| 2019/0287898 A1 | 9/2019 | Suo et al. | |
| 2019/0355678 A1 * | 11/2019 | Lin | H01L 21/32136 |

FOREIGN PATENT DOCUMENTS

WO    9221154 A1    11/1992

* cited by examiner

*Primary Examiner* — Nicholas J Tobergte
*Assistant Examiner* — William Henry Anderson
(74) *Attorney, Agent, or Firm* — Scully, Scott, Murphy & Presser, P.C.; L. Jeffrey Kelly, Esq.

(57) ABSTRACT

An anti-fuse device having enhanced programming efficiency is provided. The anti-fuse device includes via contact structures that have different critical dimensions located between a first electrode and a second electrode. Notably, a first via contact structure having a first critical dimension is provided between a pair of second via contact structures having a second critical dimension that is greater than the first critical dimension. When a voltage is applied to the device, dielectric breakdown will occur first through the first via contact structure having the first critical dimension.

19 Claims, 5 Drawing Sheets

EMBEDDED SMALL VIA ANTI-FUSE DEVICE

BACKGROUND

The present application relates to an anti-fuse device and a method of forming the same. More particularly, the present application relates to an anti-fuse device having enhanced programming efficiency and a method of forming the same.

Anti-fuse devices have been used in the semiconductor industry for memory related applications including, for example, field programmable gate arrays and programmable read-only memories. Prior art anti-fuse devices include a continuous layer of an anti-fuse material that is sandwiched between two disconnected conductive materials (i.e., a top electrode and a bottom electrode). The anti-fuse material initially has a high resistance, but it can be converted into a lower resistance by the application of a certain process. For example, and after high voltage programming, the anti-fuse structure/circuit becomes conductive/open through a dielectric breakdown phenomenon.

In such prior art anti-fuse devices, programming efficiency is a concern due to the large contact area that exists between the layer of anti-fuse material and the two electrodes. There is a need for providing an anti-fuse device having improved programming efficiency.

SUMMARY

An anti-fuse device having enhanced programming efficiency is provided. The anti-fuse device includes via contact structures that have different critical dimensions located between a first electrode and a second electrode. Notably, a first via contact structure having a first critical dimension is provided between a pair of second via contact structures having a second critical dimension that is greater than the first critical dimension. When a voltage is applied to the device, dielectric breakdown will occur first through the first via contact structure having the first critical dimension.

In one aspect of the present application, an anti-fuse device that has enhanced programming efficiency is provided. In one embodiment of the present application, the anti-fuse device includes an anti-fuse material layer located on a surface of a first electrode. A first interconnect dielectric material layer is located on the anti-fuse material layer, wherein the first interconnect dielectric material layer includes at least one set of via contact structures present therein, wherein the at least one set of via contact structures includes a first via contact structure having a first critical dimension, and a pair of second via contact structures having a second critical dimension that is greater than the first critical dimension, wherein each via contact structure includes at least a metallization liner and wherein one of the second via contact structures of the pair of second via contact structures is located laterally adjacent to a first side of the first via contact structure, and another of the second via contact structures of the pair of second via contact structures is located laterally adjacent to a second side of the first via contact structure. A second interconnect dielectric material layer is located on the first interconnect dielectric material layer, wherein a second electrode is present in the second interconnect dielectric material layer and contacts at least the first via contact structure.

In another aspect of the present application, a method of forming an anti-fuse device having enhanced programming efficiency is provided. In one embodiment of the present application, the method includes forming an anti-fuse material layer on a first electrode. Next, a first interconnect dielectric material layer is formed on the anti-fuse material layer, wherein the first interconnect dielectric material layer includes at least one set of vias present therein, wherein the at least one set of vias includes a first via having a first critical dimension, and a pair of second vias having a second critical dimension that is greater than the first critical dimension, wherein one of the second vias of the pair of second vias is located laterally adjacent to a first side of the first via, and another of the second vias of the pair of second vias is located laterally adjacent to a second side of the first via. A via contact structure is then formed in each of the first via and the pair of second vias of the at least one set of vias, wherein the forming of the via contact structure comprises at least forming a metallization liner into the first via and the pair of second vias, wherein the metallization liner present in the first via reduces the first critical dimension and the metallization liner present in the pair of second vias increases the second critical dimension. Next, a second interconnect dielectric material layer is formed on the first interconnect dielectric material layer, wherein a second electrode is present in the second interconnect dielectric material layer that contacts at least the via contact structure that is present in the first via of the at least one set of vias.

DETAILED DESCRIPTION

Figure 1:
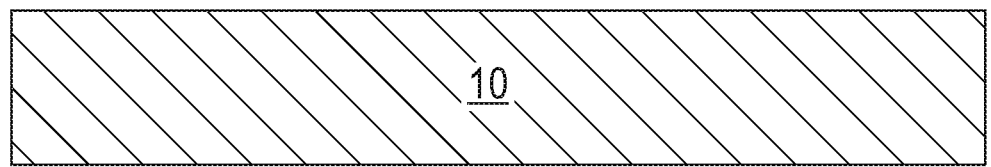
FIG. 1 is a cross sectional view of an exemplary structure that can be used in the present application in forming an anti-fuse device of the present application, the exemplary structure including a first electrode.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be used in the present application in forming an anti-fuse device of the present application. The exemplary structure of FIG. 1 includes a first electrode 10. The first electrode 10 can be present on a surface of a substrate (not shown). In one embodiment, the substrate is a semiconductor material that has semiconducting properties and which contains one or more semiconductor devices such as, for example, transistors, formed thereon. In another embodiment, the substrate is an interconnect level including an interconnect dielectric material that contains one or more electrically conductive structures embedded thereon. In such an embodiment, the interconnect level is located above a semiconductor material having semiconducting properties and containing one or more semiconductor devices formed thereon.

Notwithstanding the type of substrate employed, the first electrode 10 is composed of an electrically conductive metal or electrically conductive metal alloy. Examples of electrically conductive metals that can be employed as the first electrode 10 include, but are not limited to, copper (Cu), aluminum (Al), tungsten (W), cobalt (Co), ruthenium (Ru), tantalum (Ta), or titanium (Ti). Examples of electrically conductive metal alloys that can be employed as the first electrode 10 include, but are not limited to, any combination of the above mentioned electrically conductive metals (i.e., a Cu—Al alloy) or any above mentioned electrically conductive metals in a nitride form (i.e., TaN, TiN, or WN).

The electrically conductive metal or electrically conductive metal alloy that provides the first electrode 10 can be formed utilizing a deposition process such as, for example, chemical vapor deposition (CVD), plasma enhanced chemical vapor deposition (PECVD), sputtering, chemical solution deposition or plating. The first electrode 10 can have a thickness from 10 nm to 200 nm; although other thicknesses are possible and can be used as the thickness of the first electrode 10.

Figure 2:
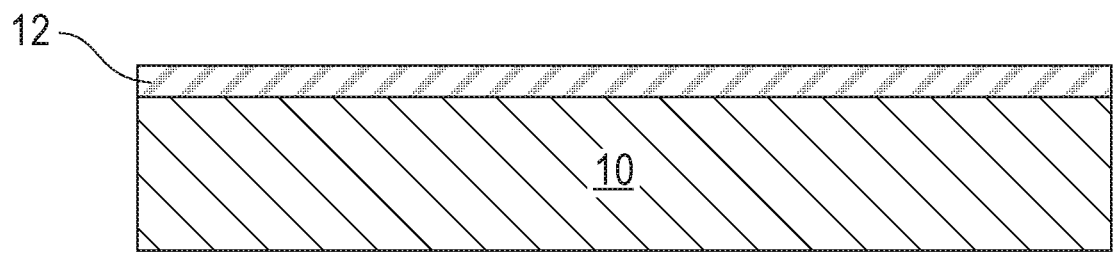
FIG. 2 is a cross sectional view of the exemplary structure of FIG. 1 after forming an anti-fuse material layer on the first electrode.

Referring now to FIG. 2, there is illustrated the exemplary structure of FIG. 1 after forming an anti-fuse material layer 12 on the first electrode 10. In accordance with the present application, the anti-fuse material layer 12 forms an interface with the underlying first electrode 10, and the anti-fuse material layer 12 is formed on an entirety of the first electrode 10.

The anti-fuse material layer 12 is composed of a dielectric material that has a dielectric constant of 3.5 or less; such dielectric materials may be referred to herein as a low-k dielectric material. All dielectric constants mentioned herein are measured relative to a vacuum, unless otherwise stated. Exemplary low-k dielectric materials that can be employed as the anti-fuse material layer 12 include, but are not limited to, a dielectric material including atoms of silicon, carbon and hydrogen, a dielectric material including atoms of silicon, carbon, hydrogen and oxygen, or a dielectric material including atoms of silicon, carbon, hydrogen and nitrogen. In one example, the low-k dielectric material that provides the anti-fuse material layer 12 can be composed of an nBLOK dielectric material that contains atoms of silicon, carbon, hydrogen, nitrogen and oxygen. In some embodiments, a single low-k dielectric material is used in providing the anti-fuse material layer 12. In other embodiments, a stack including at least two different low-k dielectric materials can be used in providing the anti-fuse material layer 12.

The anti-fuse material layer 12 can be formed utilizing a deposition such as, for example, CVD, PECVD or spin-on coating. In one example, a CVD process performed at a temperature of 550° C. or less can be employed in providing the anti-fuse material layer 12. The anti-fuse material layer 12 can have a thickness from 10 nm to 100 nm; although other thicknesses are possible and can be used as the thickness of the anti-fuse material layer 12.

Figure 3:
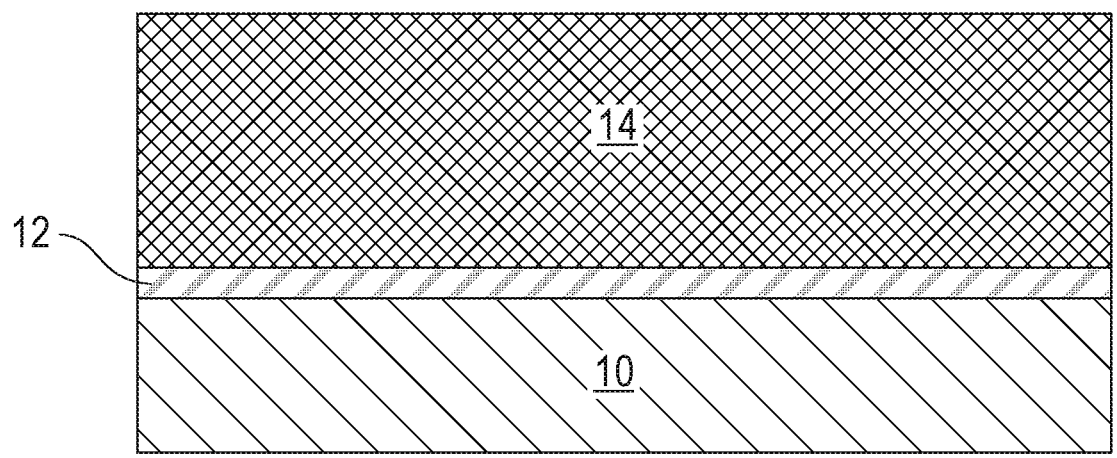
FIG. 3 is a cross sectional view of the exemplary structure of FIG. 2 after forming a first interconnect dielectric material layer on the anti-fuse material layer.

Referring now to FIG. 3, there is illustrated the exemplary structure of FIG. 2 after forming a first interconnect dielectric material layer 14 on the anti-fuse material layer 12. In accordance with the present application, the first interconnect dielectric material layer 14 forms an interface with the underlying anti-fuse material layer 12, and the first interconnect dielectric material layer 14 is present on an entirety of the underlying anti-fuse material layer 12.

The first interconnect dielectric material layer 14 is composed of a dielectric material that is compositionally different from, and has a higher dielectric breakdown than, the anti-fuse material layer 12. The first interconnect dielectric material layer 14 can be composed of an inorganic dielectric material, an organic dielectric material or a combination of inorganic and organic dielectric materials. In some embodiments, the first interconnect dielectric material layer 14 can be porous. In other embodiments, the first interconnect dielectric material layer 14 can be non-porous. Examples of suitable dielectric materials that can be employed as the first interconnect dielectric material layer 14 include, but are not limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The first interconnect dielectric material layer 14 can have a dielectric constant that is about 4.0 or less. In one embodiment, the first interconnect dielectric material layer 14 has a dielectric constant of 2.8 or less. These dielectrics generally having a lower parasitic cross talk as compared to dielectric materials whose dielectric constant is greater than 4.0.

The first interconnect dielectric material layer 14 can be formed by a deposition process such as, for example, CVD, PECVD or spin-on coating. The first interconnect dielectric material layer 14 can have a thickness from 100 nm to 500 nm. Other thicknesses that are lesser than 100 nm, and greater than 500 nm can also be employed as the thickness of the first interconnect dielectric material layer 14 in the present application.

Figure 4:
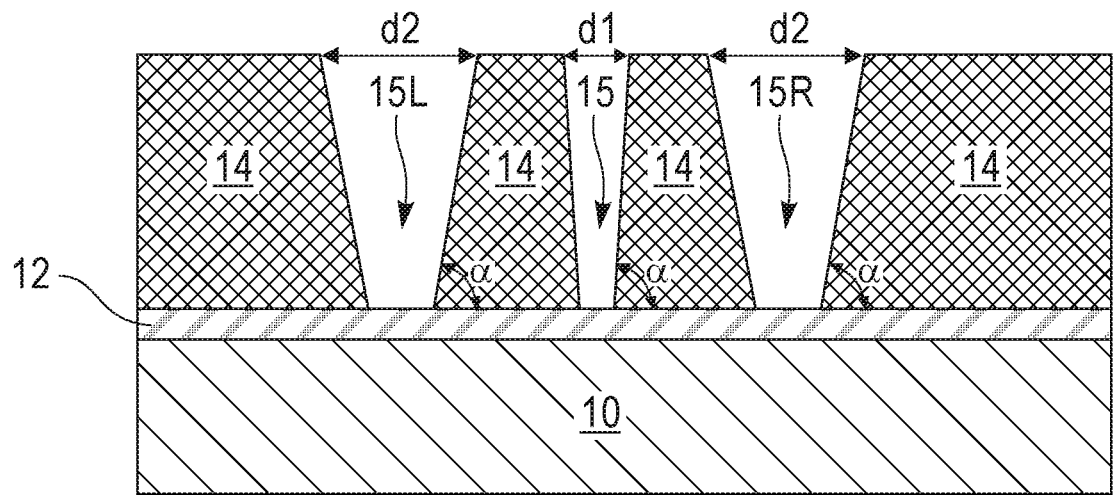
FIG. 4 is a cross sectional view of the exemplary structure of FIG. 3 after forming at least one set of vias in the first interconnect dielectric material layer, wherein the at least one set of vias includes a first via having a first critical dimension, and a pair of second vias having a second critical dimension that is greater than the first critical dimension, wherein one of the second vias of the pair of second vias is located laterally adjacent to a first side of the first via, and another of the second vias of the pair of second vias is located laterally adjacent to a second side of the first via.

Referring now to FIG. 4, there is illustrated the exemplary structure of FIG. 3 after forming at least one set of vias (15L, 15, 15R) in the first interconnect dielectric material layer 14, wherein the at least one set of vias includes a first via 15 having a first critical dimension, d1, and a pair of second vias (15L, 15R) having a second critical dimension, d2, that is greater than the first critical dimension, d1, wherein one of the second vias (e.g., second via 15L) of the pair of second vias (15L, 15R) is located laterally adjacent to a first side of the first via 15, and another of the second vias (e.g., second via 15R) of the pair of second vias (15L, 15R) is located laterally adjacent to a second side of the first via 15; in the present application, the second side of the first via 15 is opposite the first side of the first via 15.

Although the present application describes and illustrates a single set of vias (15L, 15, 15R), a plurality of such vias (15L, 15, 15R) can be formed in the first interconnect dielectric material layer 14.

In one embodiment, the first critical dimension, d1, of the first via 15 of the at least one set of vias is less than 15 nm, while the second critical dimension, d2, of the pair of second vias (15L, 15R) of the at least one set of vias is greater than 25 nm. In one example, the first critical dimension, d1, of the first via 15 of the at least one set of vias is from 10 nm to less than 15 nm, while the second critical dimension, d2, of the pair of second vias (15L, 15R) of the at least one set of vias is from greater than 25 nm to 40 nm.

The at least one set of vias (15L, 15, 15R) can be formed utilizing one or more patterning processes. The one or more patterning process can include lithography and etching, sidewall image transfer (SIT), or a direct self-assembly (DSA) process. In some embodiments, the first via 15 and the pair of second vias (15L, 15R) of the at least one set of vias are formed at the same time. In another embodiment, the first via 15 can be formed prior to, or after, forming the pair of second vias (15L, 15R) of the at least one set of vias. In the present application, each via of the at least one set of vias is spaced apart from a nearest neighboring via by a distance of from 15 nm to 60 nm.

The angle, alpha, between, a sidewall of the pair of second vias (15L, 15R) and a topmost surface of the anti-fuse material layer 12, and a sidewall of the first via 15 and the topmost surface of the anti-fuse material layer 12 is from 80° to 90°. In some embodiments, each of the vias (15L, 15, 15R) of the at least one set of vias can have tapered sidewalls. In other embodiments, each of the vias (15L, 15, 15R) of the at least one set of vias can have sidewalls that are perpendicular to the topmost surface of the anti-fuse material layer 12. In yet other embodiments, the second vias (15L, 15R) of the at least one set of vias can have tapered or perpendicular sidewalls, while the first via 15 of the at least one set of vias can have sidewalls that differ from the sidewalls of the second vias (15L, 15R) of the at least one set of vias.

Figure 5:
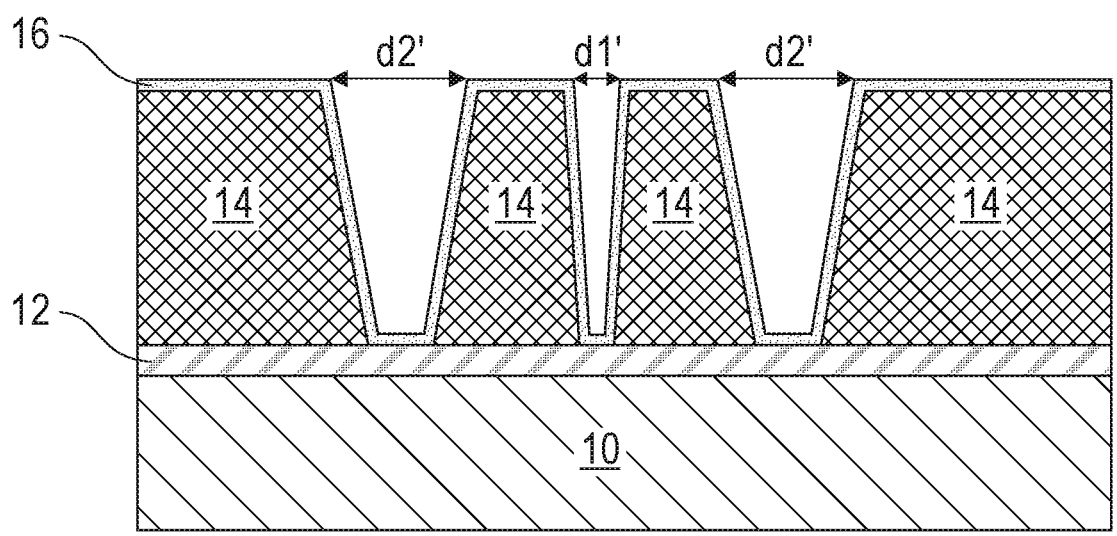
FIG. 5 is a cross sectional view of the exemplary structure of FIG. 4 after forming a metallization layer on the interconnect dielectric material layer, and within the first via and the pair of second vias of the at least one set of vias.

Referring now to FIG. 5, there is illustrated the exemplary structure of FIG. 4 after forming a metallization layer 16 on the interconnect dielectric material layer 14, and within the first via 15 and the pair of second vias (15L, 15R) of the at least one set of vias. The metallization layer 16 is a continuous layer that is formed on the interconnect dielectric material layer 14, and within the first via 15 and the pair of second vias (15L, 15R) of the at least one set of vias.

The metallization layer 16 is composed of an electrically conductive metal or metal alloy, which can be compositionally the same as, or compositionally different from, the first electrode 10. Examples of metals that can be employed as the metallization layer 16 include, but are not limited to, tungsten (W), cobalt (Co), ruthenium (Ru), rhodium (Rh), tantalum (Ta), or titanium (Ti). Examples of electrically conductive metal alloys that can be employed as the metallization layer 16 include, but are not limited to, any combination of the above mentioned electrically conductive metals (i.e., a W—Co alloy) or any above mentioned electrically conductive metals in a nitride form (i.e., TaN, TiN, or WN).

The electrically conductive metal or electrically conductive metal alloy that provides metallization layer 16 can be formed utilizing a deposition process such as, for example, CVD, physical vapor deposition (PVD) or atomic layer deposition (ALD). The metallization layer 16 can have a thickness from 1 nm to 20 nm; although other thicknesses are possible and can be used as the thickness of the metallization layer 16 as long as the thickness of the metallization layer 16 does not completely fill in the volume of the pair of second vias (15L, 15R) of the at least one set of vias. In some embodiments, the metallization layer 16 does not completely fill in the volume of the first via 15. In other embodiments, the metallization layer 16 completely fills in the volume of the first via 15; see, for example, FIG. 9 of the present application.

In some embodiments, the metallization layer 16 can be a conformal layer. The term "conformal" denotes that a material layer has a vertical thickness along horizontal surfaces that is substantially the same (i.e., within ±5%) as the lateral thickness along vertical surfaces.

The inclusion of the metallization layer 16 within the first via 15 of the least one set of vias reduces the first critical thickness, d1, of the original first via 15 to a reduced first critical dimension, d1', while the inclusion of the metallization layer 16 within the pair of second vias (15L, 15R) of the least one set of vias increases the second critical thickness, d2, of the original second vias (15L, 15R) to an increased second critical dimension, d2'. In one embodiment, the reduced first critical dimension, d1', of the first via 15 that contains the metallization layer 16 is less than 10 nm, while the increased second critical dimension, d2', of the pair of second vias (15L, 15R) that contains the metallization layer 16 is greater than 30 nm. In one example, the reduced first critical dimension, d1', of the first via 15 that contains the metallization layer 16 is from 1 nm to less than 10 nm, while the increased second critical dimension, d2', of the pair of second vias (15L, 15R) that contains the metallization layer 16 is from greater than 30 nm to 60 nm. The reduced first critical dimension, d1', of the first via 15 determines a critical dimension of a subsequently formed first via contact structure, while the increased second critical dimension determines a critical dimension of a subsequently formed pair of second via contact structures.

Figure 6:
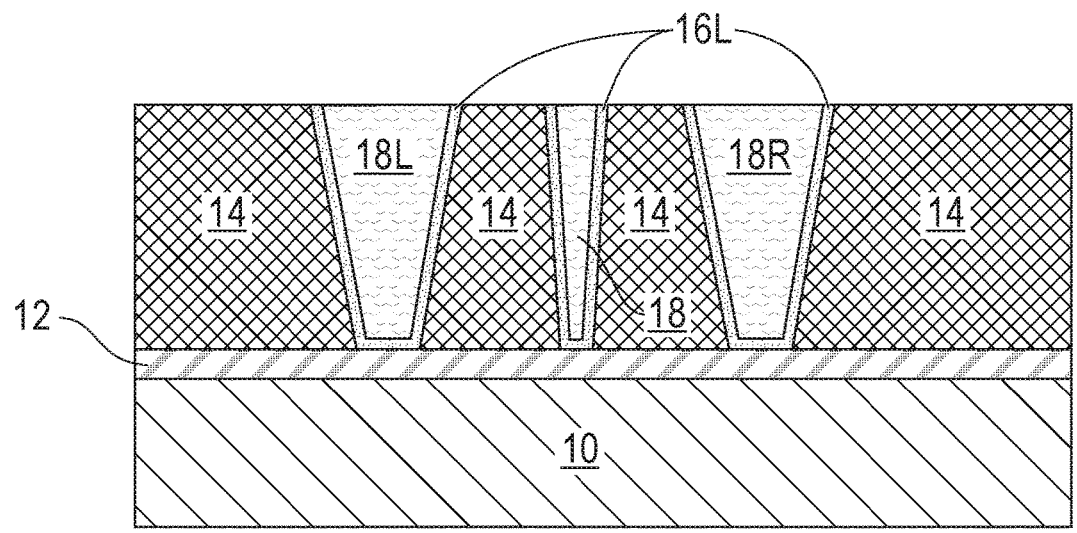
FIG. 6 is a cross sectional view of the exemplary structure of FIG. 5 after forming an electrically conductive metal-containing layer on the metallization layer, and removing, by a planarization process, the electrically conductive metal-containing layer and the metallization layer that is present outside of the first via and the pair of second vias of the at least one set of vias, while maintaining the electrically conductive metal-containing layer and the metallization layer that is present inside of the first via and the pair of second vias of the at least one set of vias.

Referring now to FIG. 6, there is illustrated the exemplary structure of FIG. 5 after forming an electrically conductive metal-containing layer (not shown) on the metallization layer 16, and removing, by a planarization process, the electrically conductive metal-containing layer and the metallization layer 16 that is present outside of the first via 15 and the pair of second vias (15L, 15R) of the at least one set of vias, while maintaining the electrically conductive metal-containing layer and the metallization layer 16 that is present inside of the first via 15 and the pair of second vias (15L, 15R) of the at least one set of vias.

The metallization layer 16 that remains in each opening can be referred to herein as a metallization liner 16L. The remaining electrically conductive metal containing layer that is present in each vias of the at least one set of vias can be referred to as a via interconnect structure (18L, 18, 18R). Collectively, and in some embodiments, the metallization liner 16L and the via interconnect structures (18L, 18, 18R) provide a via contact structure that is positioned between the first electrode 10 and a subsequently formed second electrode 26. In some embodiments, in which the first via 15 has a first critical dimension that is small enough, the first via is entirely filled with the metallization liner 16L. In such an embodiment, the metallization liner 16L that completely fills in the first via 15 can provide a via contact structure that is positioned between the first electrode 10 and a subsequently formed second electrode 26.

The electrically conductive metal-containing layer that provides the via interconnect structures (18L, 18, 18R) shown in FIG. 6 is compositionally different from the metallization layer 16. The electrically conductive metal-containing layer that provides the via interconnect structures (18L, 18, 18R) can include copper (Cu), aluminum (Al), tungsten (W) or alloys thereof (i.e., Cu—Al alloy). The electrically conductive metal-containing layer can be formed utilizing a deposition process such as, for example, CVD, PECVD, sputtering, chemical solution deposition or plating. In one embodiment, a bottom-up plating process is employed in forming the electrically conductive metal-containing layer.

The planarization can include chemical mechanical polishing (CMP) and/or grinding. After planarization, each of the via interconnect structures (18L, 18, 18R) has a topmost surface that is coplanar with each other as well as being coplanar with a topmost surface of each of the metallization liners 16L and the first interconnect dielectric material layer 14.

Figure 9:
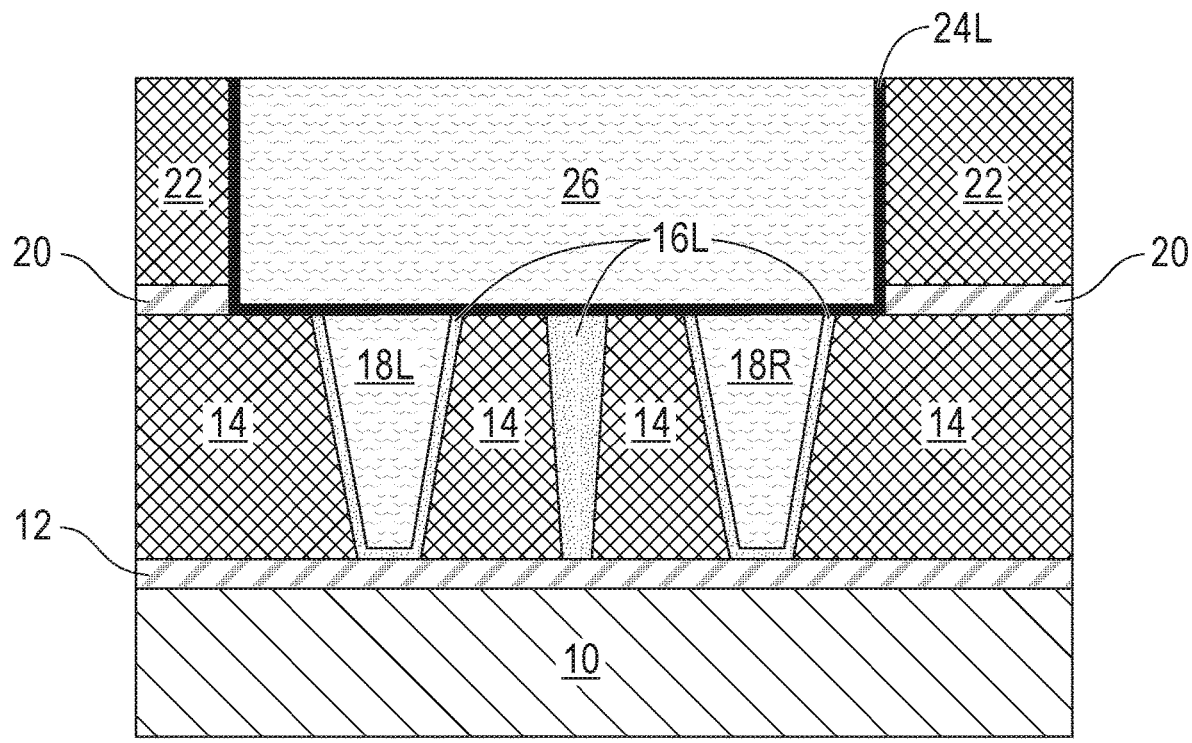
FIG. 9 is a cross sectional view of an anti-fuse device in accordance with yet another embodiment of the present application.

In the embodiment shown in FIG. 6, elements 16L/18 define a first via contact structure having the reduced first critical dimension, and elements 16L/18L and 16L/18R define a pair of second via contact structures having the increased second critical dimension. In some embodiment and as is shown in FIG. 9, the first via contact structure consists entirely of the metallization liner 16L.

Figure 7:
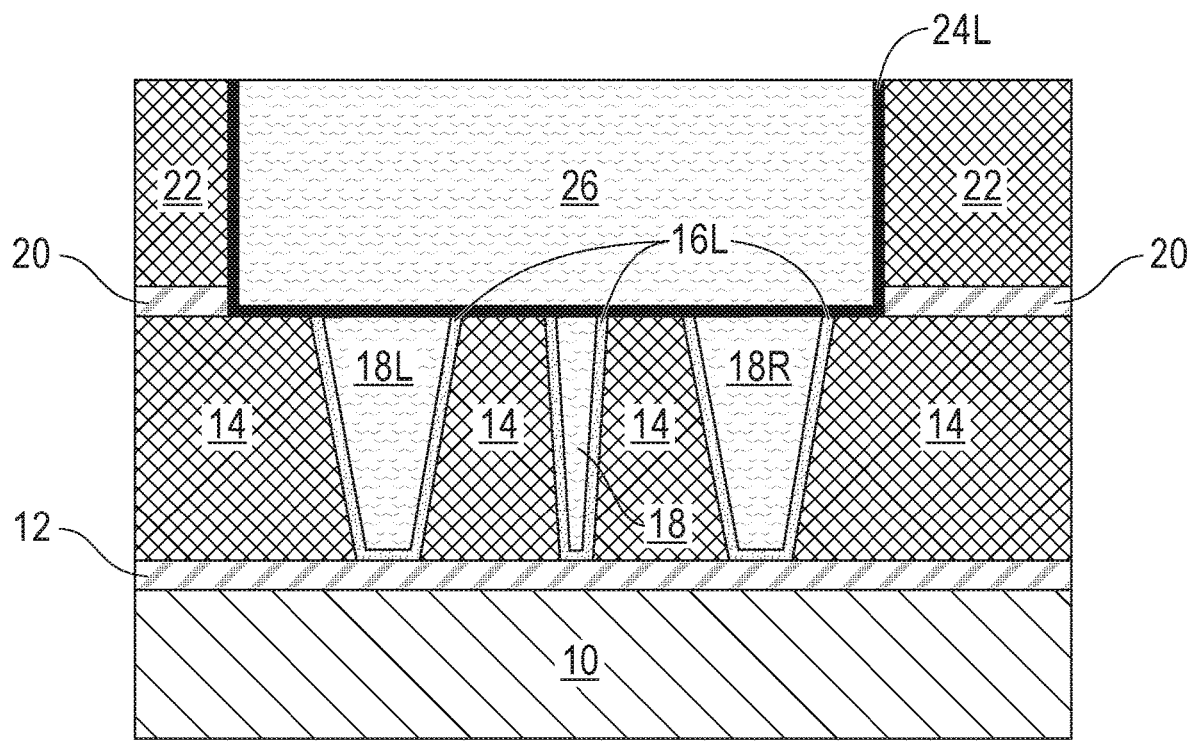
FIG. 7 is a cross sectional view of the exemplary structure of FIG. 6 after forming a dielectric capping layer, a second interconnect dielectric material layer, and a second electrode in both the second interconnect dielectric material layer and the dielectric capping layer, the exemplary structure shown in FIG. 7 represents an anti-fuse device in accordance with an embodiment of the present application.

Referring now to FIG. 7, there is illustrated the exemplary structure of FIG. 6 after forming a dielectric capping layer 20, a second interconnect dielectric material layer 22, and a second electrode 26 in both the second interconnect dielectric material layer 22 and the dielectric capping layer 20, the exemplary structure shown in FIG. 7 represents an anti-fuse device in accordance with an embodiment of the present application.

In some embodiments, the dielectric capping layer 20 can be omitted. When present, the dielectric capping layer 20 can be composed of a dielectric material that is compositionally different from the dielectric material of the first interconnect dielectric material layer 14. Illustrative examples of dielectric materials that can be used as the dielectric capping layer 20 include, but are not limited to, SiC, $Si_3N_4$, $SiO_2$, a carbon doped oxide, a nitrogen and hydrogen doped silicon carbide SiC(N,H) or multilayers thereof. The dielectric capping layer 20 can be formed utilizing a deposition process such as, for example, CVD, PECVD, chemical solution deposition, evaporation, or ALD.

The second interconnect dielectric material layer 22 is composed of a dielectric material that is compositionally different from the dielectric material that provides the dielectric capping layer 20. The second interconnect dielectric material layer 22 can be composed of one of the dielectric materials mentioned above for the first interconnect dielectric material layer 14. In some embodiments, the second interconnect dielectric material layer 22 can be composed of a dielectric material that is compositionally the same as the dielectric material that provides the first interconnect dielectric material layer 14. In other embodiments, the second interconnect dielectric material layer 22 can be composed of a dielectric material that is compositionally different than the dielectric material that provides the first interconnect dielectric material layer 14. The second interconnect dielectric material layer 22 can be formed utilizing one of the deposition processes mentioned above for forming the first interconnect dielectric material layer 14. The second interconnect dielectric material layer 22 can have a thickness within the range mentioned above for the first interconnect dielectric material layer 14.

Second electrode 26 is then formed into the second interconnect dielectric material layer 22 and, if present, the dielectric capping layer 20. In the illustrated embodiment, the second electrode 26 contacts each of the underlying via contact structures (e.g., 16L/18L, 16L/18, and 16L/18R). In some embodiments, a diffusion barrier liner 24L can be present along the sidewalls and the bottom wall of the second electrode 26. In other embodiments, the diffusion barrier liner 24L can be omitted.

The second electrode 26 can be formed by first forming an opening (not shown) into the second interconnect dielectric material layer 22 and, if present, the dielectric capping layer 20. The opening physically exposes a topmost surface of the underlying via contact structures (e.g., 16L/18L, 16L/18, and 16L/18R) present in the first interconnect dielectric material layer 14. The opening can be formed by lithography and etching. A diffusion barrier material layer can then be formed into the opening that is formed into the second interconnect dielectric material layer 22 and atop the second interconnect dielectric material layer 22. The diffusion barrier material layer can be composed of Ta, TaN, Ti, TiN, Ru, RuN, RuTa, RuTaN, W, WN or any other material that can serve as a barrier to prevent a conductive material from diffusing there through. The thickness of the diffusion barrier material layer can vary depending on the deposition process used as well as the material employed. In some embodiments, the diffusion barrier material layer can have a thickness from 2 nm to 50 nm; although other thicknesses for the diffusion barrier material layer are contemplated and can be employed in the present application as long as the diffusion barrier material layer does not entirely fill the opening that is formed into the second interconnect dielectric material layer 22. The diffusion barrier material layer can be formed by a deposition process including, for example, CVD, PECVD, ALD, PVD, sputtering, chemical solution deposition or plating.

Next, an electrically conductive-metal containing layer is formed on the diffusion barrier material layer. When the diffusion barrier material layer is omitted, the electrically conductive-metal containing layer is formed into the opening that is formed into the second interconnect dielectric material layer 22 and atop the second interconnect dielectric material layer 22. The electrically conductive metal-containing layer includes one of the materials mentioned above for the first electrode. The electrically conductive metal-containing layer can be formed utilizing one of the deposition process mentioned above in forming the first electrode 10.

A planarization process such as, for example, chemical mechanical polishing (CMP) and/or grinding, can be used to remove the overburden electrically conductive-metal containing layer and, if present, the overburden diffusion barrier material layer that is located outside the opening that is formed in the second interconnect dielectric material layer 22. The planarization process maintains the electrically conductive-metal containing layer and, if present, the diffusion barrier material layer inside the opening. The diffusion barrier material layer that is maintained in the opening that is located in the second interconnect dielectric material 22 can be referred to as a diffusion barrier liner 24L, while the electrically conductive-metal containing layer that is maintained in the opening that is located in the second interconnect dielectric material 22 can be referred to as the second electrode 26. As is shown, the second electrode 26 has a topmost surface that is coplanar with a topmost surface of the second interconnect dielectric material layer 20. When present, the second electrode 26 has a topmost surface that is coplanar with a topmost surface of each of the second interconnect dielectric material layer 20 and the diffusion barrier liner 24L. In the present application, first electrode 10 can be referred to as a bottom electrode, and second electrode 26 can be referred to as a top electrode.

FIG. 7 illustrates an exemplary anti-fuse device in accordance with an embodiment of the present application. The exemplary anti-fuse device shown in FIG. 7 includes anti-fuse material layer 12 located on a surface of first electrode 10. First interconnect dielectric material layer 14 is located on the anti-fuse material layer 12, wherein the first interconnect dielectric material layer 14 includes at least one set of via contact structures present therein, wherein the at least one set of via contact structures includes a first via contact structure (16L/18) having a first critical dimension, and a pair of second via contact structures (16L/18L and 16L/18R) having a second critical dimension that is greater than the first critical dimension, wherein each via contact structure includes at least a metallization liner 16L and wherein one of the second via contact structures (e.g., 16L/18L) of the pair of second via contact structures is located laterally adjacent to a first side of the first via contact structure (16L,18), and another of the second via contact structures (e.g., 16L/18R) of the pair of second via contact structures is located laterally adjacent to a second side of the first via contact structure (16L/18). Second interconnect dielectric material layer 22 is located on the first interconnect dielectric material layer 14, wherein second electrode 26 is present in the second interconnect dielectric material layer 22 and contacts at least the first via contact structure (16L/18) that is present in the first interconnect dielectric material layer 14.

It is noted that the first critical dimension of the first via contact structure refers to the reduced first critical dimension (i.e., d1') mentioned above for the first via 15, while the second critical dimension of the second via contacts refers to the increased second critical dimension (i.e., d2') mentioned above for the pair of second vias (15L, 15R). It is also noted that angle, alpha, mentioned above exists between a sidewall of the pair of second via contact structures (16L/18L and 16L/18R) and a topmost surface of the anti-fuse material layer 12, and the angle, alpha, mentioned above, exists between a sidewall of the first via contact structure (16L/18 or just 16L in the case of the structure shown in FIG. 9) and a topmost surface of the anti-fuse material layer 12.

When a voltage is applied to the structure shown in FIG. 7, the anti-fuse dielectric material layer 14 that is located directly beneath the first via contact structure (16L/18) will undergo dielectric breakdown prior to the anti-fuse dielectric material layer 14 that is located directly beneath the second via contact structures (16L/18L and 16L/18R) due to the higher electrical field that is provided by the first via contact structure (16L/18) that is present in the first via 15. Notably, the smaller dimension via provides higher voltage for the breakdown path. After dielectric breakdown, the second electrode 26 electrically contacts the first electrode 10. In accordance with the present application, only a small portion of dielectric breakdown is sufficient for program.

Figure 8:
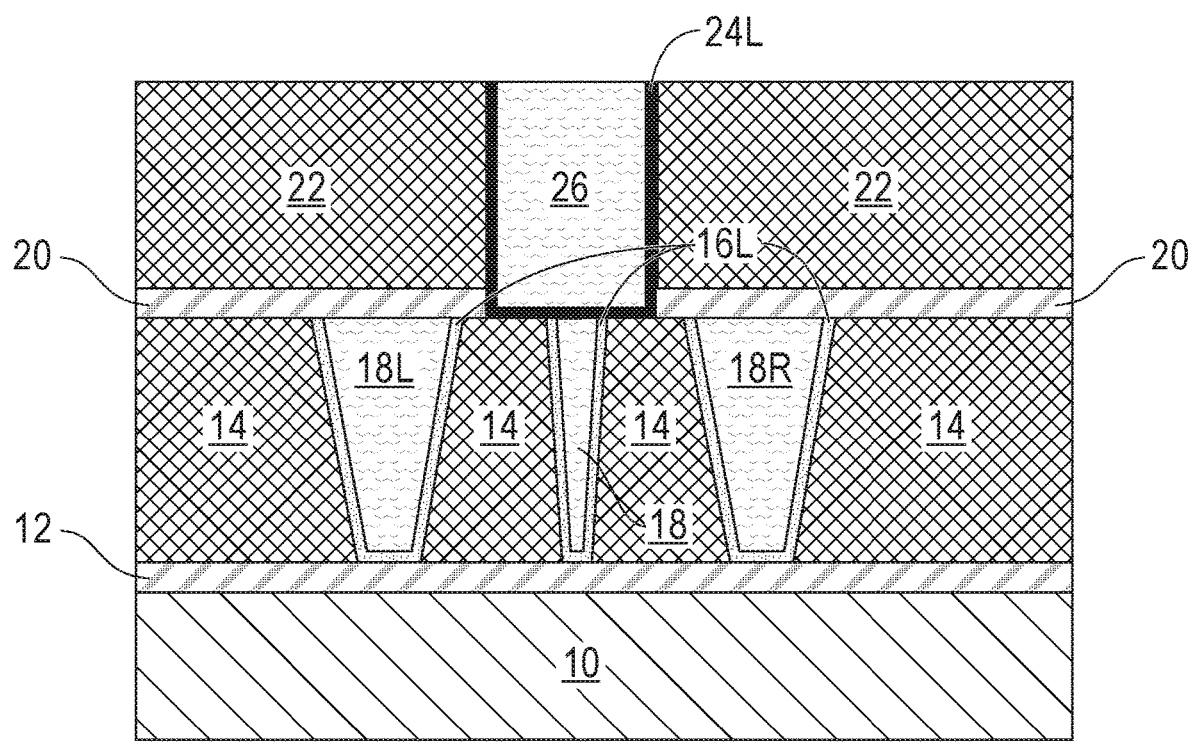
FIG. 8 is a cross sectional view of an anti-fuse device in accordance with another embodiment of the present application.

Referring now to FIGS. 8-9, there are shown other anti-fuse devices in accordance with the present application. The anti-fuse device of FIG. 8 is similar to the anti-fuse device shown in FIG. 7 except that the second electrode 26 electrically contacts only the first via contact structure (16L/18) that is present in the first via 15. The anti-fuse device of FIG. 9 is similar to the anti-fuse device shown in FIG. 7 except that first via contact structure that is present in the first via 15 consists of only the metallization liner 16L.

When a voltage is applied to the structure shown in FIG. 8, the anti-fuse dielectric material layer 14 that is located directly beneath the first via contact structure (16L/18) will undergo dielectric breakdown prior to the anti-fuse dielectric material layer 14 that is located directly beneath the second via contact structures (16L/18L and 16L/18R) due to the higher electrical field that is provided by the first via contact structure (16L/18) that is present in the first via 15. After dielectric breakdown, the second electrode 26 electrically contacts the first electrode 10. In accordance with the present application, only a small portion of dielectric breakdown is sufficient for program.

When a voltage is applied to the structure shown in FIG. 9, the anti-fuse dielectric material layer 14 that is located directly beneath the first via contact structure containing only the metallization liner 16L will undergo dielectric breakdown prior to the anti-fuse dielectric material layer 14 that is present directly beneath the second via contact structures (16L/18L and 16L/18R) that are present in the second vias (15L, 15R) due to the higher electrical field that is provided by the first via contact structure containing only the metallization liner 16L that is present in the first via 15. After dielectric breakdown, the second electrode 26 electrically contacts the first electrode 10. In accordance with the present application, only a small portion of dielectric breakdown is sufficient for program.

Figure 10:
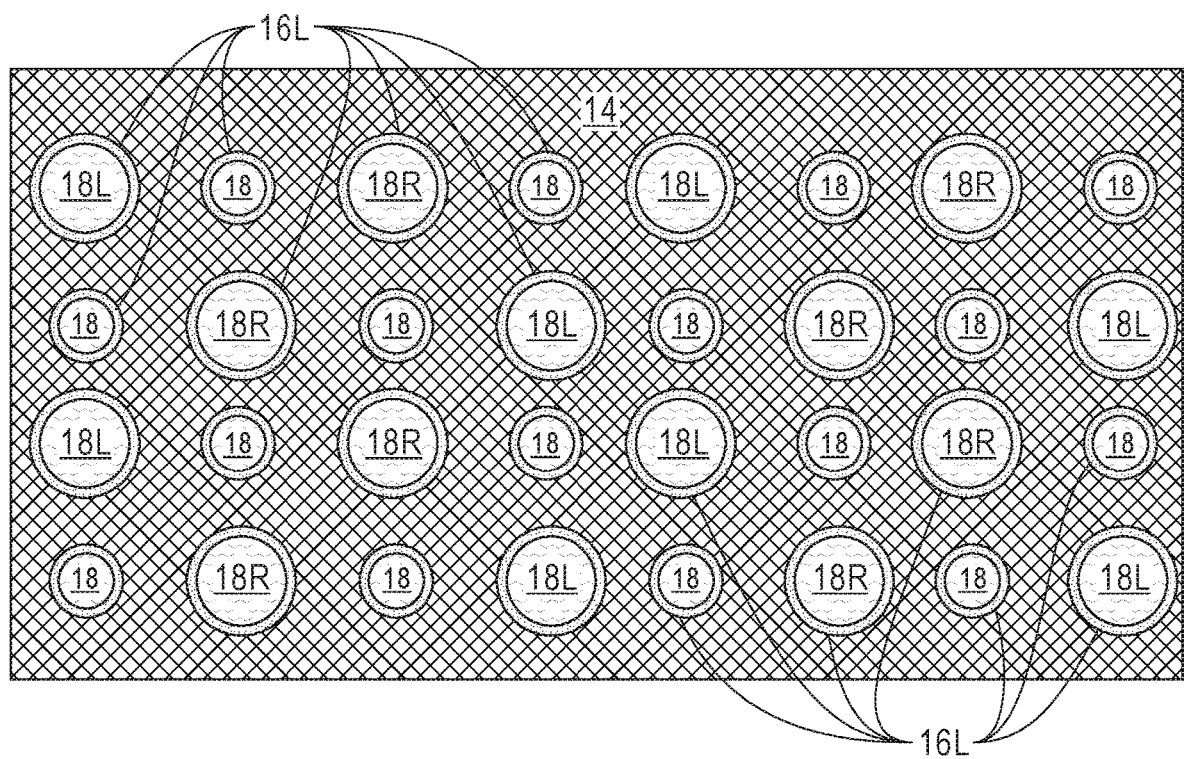
FIG. 10 is a top down view of an anti-fuse device of the present application at a level including a first interconnect dielectric material layer that includes an array of via contact structures.

Referring now to FIG. 10, there is illustrated a top down view of an anti-fuse device of the present application at a level including the first interconnect dielectric material layer 14 that includes an array of via contact structures (16L/18L, 16L/18 and 16L/16R). In the illustrated drawing, each via contact structure (16L/18) that is present in a first via opening 15 will undergo dielectric breakdown prior to the via contact structures (16L/18L and 16L/18R) that are present in each second via (15L, 15R) due to the higher electrical field that is provided by each via contact structure (16L/18) that is present in a first via 15.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An anti-fuse device comprising:
an anti-fuse material layer located on a surface of a first electrode, wherein the first electrode is composed of a first electrically conductive metal or a first electrically conductive metal alloy;
a first interconnect dielectric material layer located on the anti-fuse material layer, wherein the first interconnect dielectric material layer includes at least one set of via contact structures present therein, wherein the at least one set of via contact structures includes a first via contact structure having a first critical dimension, and a pair of second via contact structures having a second critical dimension that is greater than the first critical dimension, wherein each via contact structure includes at least a metallization liner and wherein one of the second via contact structures of the pair of second via contact structures is located laterally adjacent to a first side of the first via contact structure, and another of the second via contact structures of the pair of second via contact structures is located laterally adjacent to a second side of the first via contact structure; and
a second interconnect dielectric material layer located on the first interconnect dielectric material layer, wherein a second electrode composed of a second electrically conductive metal or a second electrically conductive metal alloy is present in the second interconnect dielectric material layer and contacts at least the first via contact structure that is present in the first interconnect dielectric material layer, wherein the second electrode is entirely spaced apart from the anti-fuse material layer by the first interconnect dielectric material layer and at least the first via contact structure.

2. The anti-fuse device of claim 1, wherein the anti-fuse dielectric material layer that is located directly beneath the first via contact structure undergoes dielectric breakdown prior to the anti-fuse dielectric material layer that is located directly beneath the second via contact structures due to the higher electrical field that is provided by the first via contact structure.

3. The anti-fuse device of claim 2, wherein each of the via contact structures further comprises a via interconnect structure located on the metallization liner.

4. The anti-fuse device of claim 2, wherein each of the via contact structures of the pair of second via contact structures further comprises a via interconnect structure located on the metallization liner, and wherein the first via contact structure consists of the metallization liner.

5. The anti-fuse device of claim 1, wherein the second electrode contacts only the first via contact structure.

6. The anti-fuse device of claim 1, wherein the second electrode further contacts the pair of second via contact structures.

7. The anti-fuse device of claim 1, wherein an angle between a sidewall of the pair of second via contact structures and a topmost surface of the anti-fuse material layer is from 80°-90°, and an angle between a sidewall of the first via contact structure and a topmost surface of the anti-fuse material layer is from 80°-90°.

8. The anti-fuse device of claim 1, wherein the first critical dimension is less than 10 nm, and the second critical dimension is greater than 30 nm.

9. The anti-fuse device of claim 1, further comprising a diffusion barrier liner located on sidewalls and a bottom wall of the second electrode.

10. The anti-fuse device of claim 1, further comprising a dielectric capping layer located between the first interconnect dielectric material layer and the second interconnect dielectric material layer, wherein a lower portion of the second electrode is present in the dielectric capping layer.

11. The anti-fuse device of claim 10, further comprising a diffusion barrier liner located on sidewalls and a bottom wall of the second electrode.

12. A method of forming an anti-fuse device, the method comprising:
forming an anti-fuse material layer on a first electrode, wherein the first electrode is composed of a first electrically conductive metal or a first electrically conductive metal alloy;
forming a first interconnect dielectric material layer on the anti-fuse material layer, wherein the first interconnect dielectric material layer includes at least one set of vias present therein, wherein the at least one set of vias includes a first via having a first critical dimension, and a pair of second vias having a second critical dimension that is greater than the first critical dimension, wherein one of the second vias of the pair of second vias is located laterally adjacent to a first side of the first via, and another of the second vias of the pair of second vias is located laterally adjacent to a second side of the first via;
forming a via contact structure in each of the first via and the pair of second vias of the at least one set of vias, wherein the forming of the via contact structure comprises at least forming a metallization liner into the first via and the pair of second vias; and
forming a second interconnect dielectric material layer on the first interconnect dielectric material layer, wherein a second electrode is composed of a second electrically conductive metal or a second electrically conductive metal alloy and is present in the second interconnect dielectric material layer that contacts at least the via contact structure that is present in the first via of the at least one set of vias, and wherein the second electrode is entirely spaced apart from the anti-fuse material layer by the first interconnect dielectric material layer and the via contact structure.

13. The method of claim 12, further comprising applying a voltage to the device, wherein during the applying of the voltage the anti-fuse dielectric material layer that is located directly beneath the first via contact structure undergoes dielectric breakdown prior to the anti-fuse dielectric material layer that is located directly beneath the second via contact structures due to the higher electrical field that is provided by the first via contact structure.

14. The method of claim 12, wherein the forming of each of the via contact structures further comprises forming a via interconnect structure on the metallization liner.

15. The method of claim 12, wherein the forming of via contact structures in the pair of second vias further comprises forming a via interconnect structure on the metallization liner that is present in the pair of second vias, and wherein the forming of the via contact structure in the first via only includes forming the metallization liner in the first via.

16. The method of claim 12, wherein the second electrode contacts only the via contact structure present in the first via.

17. The method of claim 12, wherein the second electrode further contacts the via contact structure present in the pair of second vias.

18. The method of claim 12, wherein an angle between a sidewall of the pair of second vias and a topmost surface of the anti-fuse material layer is from 80°-90°, and an angle between a sidewall of the first via and a topmost surface of the anti-fuse material layer is from 80°-90°.

19. The method of claim 12, further comprising a diffusion barrier liner located on sidewalls and a bottom wall of the second electrode.

\* \* \* \* \*